(12) United States Patent
Nardi

(10) Patent No.: US 10,290,348 B1
(45) Date of Patent: May 14, 2019

(54) WRITE-ONCE READ-MANY AMORPHOUS CHALCOGENIDE-BASED MEMORY

(71) Applicant: SANDISK TECHNOLOGIES LLC, Plano, TX (US)

(72) Inventor: Federico Nardi, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/972,596

(22) Filed: May 7, 2018

Related U.S. Application Data

(60) Provisional application No. 62/629,678, filed on Feb. 12, 2018.

(51) Int. Cl.
- *G11C 13/00* (2006.01)
- *H01L 45/00* (2006.01)
- *H01L 27/24* (2006.01)

(52) U.S. Cl.
CPC ........ *G11C 13/0004* (2013.01); *G11C 13/004* (2013.01); *G11C 13/0069* (2013.01); *H01L 27/2454* (2013.01); *H01L 27/2481* (2013.01); *H01L 45/06* (2013.01); *H01L 45/1233* (2013.01); *H01L 45/141* (2013.01); *G11C 2213/71* (2013.01); *G11C 2213/79* (2013.01)

(58) Field of Classification Search
CPC ........................ G11C 11/1675; G11C 13/0004
USPC .................................................. 365/158, 163
See application file for complete search history.

(56) References Cited

U.S. PATENT DOCUMENTS

| | | | | |
|---|---|---|---|---|
| 4,272,562 A * | 6/1981 | Wood | ...................... | H01L 45/06 257/E45.002 |
| 5,330,630 A * | 7/1994 | Klersy | .................. | H01L 45/040 204/192.15 |
| 7,560,721 B1 * | 7/2009 | Breitwisch | ......... | G11C 13/0004 257/2 |
| 10,163,977 B1 * | 12/2018 | Fantini | ................ | H01L 27/2427 |
| 2008/0106925 A1 * | 5/2008 | Paz de Araujo | ........ | H01L 45/04 365/148 |
| 2010/0176367 A1 | 7/2010 | Liu | | |

(Continued)

OTHER PUBLICATIONS

PCT International Search Report and Written Opinion of the International Searching Authority dated Mar. 5, 2019, PCT Patent Application No. PCT/US2018/061825.

*Primary Examiner* — Michael T Tran
(74) *Attorney, Agent, or Firm* — Vierra Magen Marcus LLP

(57) ABSTRACT

Systems and methods for providing a one-time programmable chalcogenide-based memory with improved memory cell IV characteristics are described. The memory cells of the one-time programmable chalcogenide-based memory may include a chalcogenide-based material. The chalcogenide-based material may comprise a germanium-antimony-tellurium compound (GST), a chalcogenide glass, or a chalcogenide alloy such as $Ge_{10}Se_{54}As_{36}$ or $Ge_{17}Te_{50}As_{33}$. The chalcogenide-based memory may be written as a one-time programmable memory in which forming operations are performed on only memory cells that are to be programmed to store a first binary value (e.g., binary "1" data values) and not performed on other memory cells that are to store a second binary value different from the first binary value (e.g., binary "0" data values).

27 Claims, 13 Drawing Sheets

(56) References Cited

U.S. PATENT DOCUMENTS

| | | | |
|---|---|---|---|
| 2012/0096246 A1* | 4/2012 | Pio | G06F 12/0638 |
| | | | 712/233 |
| 2012/0195113 A1* | 8/2012 | Yoon | G11C 13/0004 |
| | | | 365/163 |
| 2014/0009998 A1 | 1/2014 | Schloss et al. | |
| 2014/0146592 A1* | 5/2014 | Karpov | G11C 13/0011 |
| | | | 365/148 |
| 2014/0332748 A1 | 11/2014 | Khoueir et al. | |
| 2014/0365688 A1* | 12/2014 | Lee | H01L 43/08 |
| | | | 710/7 |
| 2015/0069314 A1 | 3/2015 | Arayashiki et al. | |
| 2015/0357033 A1* | 12/2015 | Kilmer | G11C 13/003 |
| | | | 365/148 |
| 2015/0380085 A1* | 12/2015 | Park | G11C 13/0069 |
| | | | 365/148 |
| 2017/0084667 A1* | 3/2017 | Lim | H01L 27/222 |
| 2017/0109075 A1* | 4/2017 | Lee | G06F 12/08 |
| 2017/0109076 A1* | 4/2017 | Kim | G06F 3/0611 |
| 2017/0236580 A1* | 8/2017 | Chu | G11C 13/0004 |
| | | | 365/163 |
| 2017/0309681 A1 | 10/2017 | Tanaka et al. | |
| 2017/0340971 A1* | 11/2017 | Schwaiger | A63F 13/20 |
| 2018/0033696 A1* | 2/2018 | Nakagawa | G11C 8/10 |
| 2018/0088810 A1* | 3/2018 | Ramalingam | G06F 3/0604 |
| 2018/0189202 A1* | 7/2018 | Yap | G06F 13/1668 |
| 2018/0204616 A1* | 7/2018 | Park | G11C 13/0023 |
| 2018/0285732 A1* | 10/2018 | Kurian | G06N 3/04 |
| 2018/0350831 A1* | 12/2018 | Kim | H01L 27/11582 |
| 2018/0365142 A1* | 12/2018 | Sandberg | G06F 12/0246 |
| 2018/0374900 A1* | 12/2018 | Pellizzer | H01L 27/2463 |
| 2019/0057734 A1* | 2/2019 | Onuki | G11C 11/419 |
| 2019/0066781 A1* | 2/2019 | Rajamohanan | G11C 13/0069 |

\* cited by examiner

US 10,290,348 B1

WRITE-ONCE READ-MANY AMORPHOUS CHALCOGENIDE-BASED MEMORY

CLAIM OF PRIORITY

The present application claims priority to U.S. Provisional Application No. 62/629,678, entitled "Write-Once Read-Many Phase Change Memory," filed Feb. 12, 2018, which is herein incorporated by reference in its entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations and increased leakage currents through unselected memory cells.

DETAILED DESCRIPTION

Figure 1A:
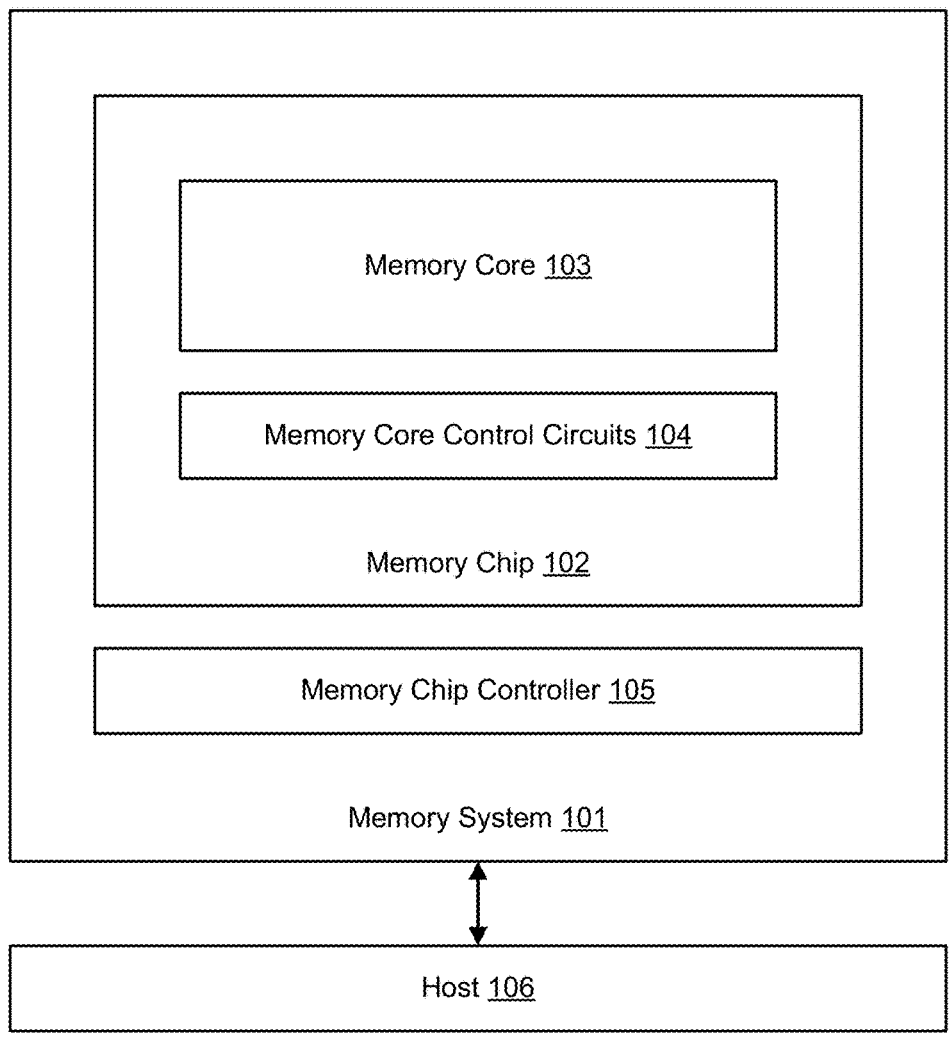
FIGS. 1A-1F depict various embodiments of a memory system.

Technology is described for providing a one-time programmable chalcogenide-based memory with improved memory cell current/voltage (IV) characteristics. The memory cells of the one-time programmable chalcogenide-based memory may include a chalcogenide-based material. Although a phase change material in a phase change memory is commonly arranged in series with a heating element (or a heater) to locally heat portions of the phase change material and cause the phase change material to transition between a higher-resistance amorphous state and a lower-resistance crystalline state, the switching mechanism for the one-time programmable chalcogenide-based memory is different and does not require the presence of a heating element. Instead, one or more conductive filamentary paths may be formed through at least a portion of a chalcogenide-based material due to the application of an initial filamentary forming voltage or a first-fire voltage across the chalcogenide-based material. The one or more conductive filamentary paths may be formed due to a local rearrangement of atoms or atomic bonds between atoms within the chalcogenide-based material caused by the application of the first-fire voltage across the chalcogenide-based material. In some cases, the crystallization temperature and/or the melting temperature for the chalcogenide-based material may be higher than the temperature achievable during a programming operation or during any programming operation (e.g., a set or reset operation) subsequent to the formation of the one or more conductive filamentary paths. In one example, both the crystallization temperature and the melting temperature for the chalcogenide-based material may be greater than the temperature generated within the chalcogenide-based material during a programming operation subsequent to the formation of the one or more conductive filamentary paths. The chalcogenide-based memory material may comprise a germanium-antimony-tellurium compound (GST), a chalcogenide glass, or a chalcogenide alloy such as $Ge_{10}Se_{54}As_{36}$ or $Ge_{17}Te_{50}As_{33}$. In some embodiments, a cross-point memory array may include a plurality of one-time programmable chalcogenide-based memory cells. Each of the one-time programmable chalcogenide-based memory cells may be placed in series with an isolation element, such as a diode, in order to reduce leakage currents through unselected memory cells within the memory array. In other cases, the one-time programmable chalcogenide-based memory cells may not be arranged in series with or include an isolation element.

A chalcogenide-based material, such as $Ge_{10}Se_{54}As_{36}$ or $Ge_{17}Te_{50}As_{33}$, may experience a first-fire effect such that once a first-fire voltage is applied across the chalcogenide-based material for the first time, the current/voltage characteristics for the chalcogenide-based material may be permanently changed. For example, the chalcogenide-based material may exhibit different currents in response to the same voltage applied to the chalcogenide-based memory cell depending on whether the chalcogenide-based material has experienced the first-fire effect. The first-fire voltage may be a function of the thickness of the chalcogenide-based material and may comprise the voltage necessary to switch the chalcogenide-based material for the first time after fabrication from a high-resistance state (or a non-conducting state) to a lower-resistance state (or a conducting state). The first-fire voltage may be applied to the chalcogenide-based material during a forming operation for a chalcogenide-based memory cell. The forming operation or the first-fire forming operation may be used as the one and only programming operation for a one-time programmable chalcogenide-based memory cell. In some cases, the first-fire voltage (e.g., 8V) applied during a forming operation may be 2× to 4× the programming voltage (e.g., 2V) used for setting and/or resetting a chalcogenide-based memory cell after the forming operation has been performed on the chalcogenide-based memory cell. One benefit of using the first-fire forming operation as the one and only programming operation for a one-time programmable chalcogenide-based memory cell is that the difference between currents for storing different data values may be increased.

In some embodiments, a chalcogenide-based memory may be written as a one-time programmable memory in which forming operations are performed on only memory cells that are to be programmed to store a first binary value (e.g., binary "1" data values) and not performed on other memory cells that are to store a second binary value different from the first binary value (e.g., binary "0" data values). In this case, "first-fire" forming operations may be used as the programming operations for a subset of the chalcogenide-based memory cells within the one-time programmable chalcogenide-based memory that are to store the first binary value. A first-fire forming operation may cause a conductive filamentary path to be formed through at least a portion of a chalcogenide-based memory cell. A native chalcogenide-based memory cell that has not experienced a first-fire forming operation may not contain any conductive filamentary paths through the chalcogenide-based memory cell.

In some embodiments, a chalcogenide-based memory (with or without a selector/isolation device in series with the chalcogenide-based material) may be programmed as a one-time programmable memory in which forming operations are performed on only a subset of the memory cells (e.g., the "first fire" forming operations may only be performed on memory cells that are to be set into a conducting or low-resistance state) and not performed on other memory cells (e.g., the "first fire" forming operations are not performed or never performed on memory cells that are to remain in a virgin state or a high-resistance state). In this case, both the subset of memory cells that have undergone a first-fire forming operation and the other memory cells that have not undergone the first-fire forming operation may be subsequently read during a read operation in order to interpret and output stored data values corresponding with the one-time programmable memory.

In some embodiments, the memory cell stack for a chalcogenide-based memory cell may comprise only a layer of a chalcogenide-based material arranged between a word line layer (e.g., a first tungsten layer) and a bit line layer (e.g., a second tungsten layer), in which the chalcogenide-based material directly contacts both the bit line layer and the word line layer. In some cases, the memory cell stack may comprise a layer of a chalcogenide-based material arranged between a first layer of carbon that directly contacts a word line layer (e.g., a first tungsten layer) and a second layer of carbon that directly contacts a bit line layer (e.g., a second tungsten layer). In other cases, the memory cell stack may comprise a layer of a chalcogenide-based material arranged between a word line layer (e.g., a first tungsten layer) and a bit line layer (e.g., a second tungsten layer), in which a single layer of carbon is arranged between the word line layer and the bit line layer that directly contacts the layer of chalcogenide-based material and one of the word line layer or the bit line layer. The single layer of carbon may have a 10 nm thickness or a 5 nm thickness. In some cases, the layer of carbon may improve the endurance of the chalcogenide-based memory cell and/or reduce ion migration within the chalcogenide-based memory cell.

In some embodiments, a chalcogenide-based memory cell may be part of a three-dimensional self-rectifying Ovonic Write-Once-Read-Many (OWORM) memory. A three-dimensional self-rectifying OWORM memory may include self-rectifying memory cells that comprise amorphous semiconducting materials, such as chalcogenide-based, oxide-based, boron-based, or carbon-based glasses combined with one or more elements from groups III, IV, V, and VI. For example, the amorphous semiconducting materials may comprise binaries (e.g., $Ge_xTe_y$), ternaries (e.g., $Ge_xTe_yAs_z$), or quaternaries (e.g., $Ge_xTe_ySe_zAs_w$) and may include dopants such as Nitrogen, Carbon, Silicon, or Boron. The use of self-rectifying memory cells means that the self-rectifying Ovonic Write-Once-Read-Many (OWORM) memory may be operated without the use of selectors or isolation devices. Each of the self-rectifying memory cells may have exponential sub-threshold conduction followed by threshold switching once a threshold voltage across the memory cell has been reached. Each of the self-rectifying memory cells may have a nonlinear current/voltage characteristic. The self-rectifying memory cells within the OWORM may be used in horizontal or vertical cross-point memory arrays and may have symmetric current/voltage characteristics. The symmetric current/voltage characteristics for the self-rectifying memory cells may occur for both programmed memory cells and unprogrammed memory cells.

In some cases, the crystallization temperature and/or the melting temperature for the chalcogenide-based material used in a one-time programmable chalcogenide-based memory may be greater than any temperature used during soldering of a memory die for the one-time programmable chalcogenide-based memory to a printed circuit board, during packaging of the memory die, or during mounting of the memory die or a package containing the memory die to a printed circuit board. In this case, the chalcogenide-based material may be solder reflow resistant or highly resistant to the temperatures used when mounting the memory die on a printed circuit board. For example, the melting temperature of the chalcogenide-based material (e.g., a chalcogenide glass) may be greater than a maximum manufacturing temperature used during the mounting or soldering of a package containing the chalcogenide-based material. The maximum manufacturing temperature may comprise the highest temperature applied to or surrounding the package during mounting or soldering of the package (e.g., to a printed circuit board). Moreover, the memory cells within the one-time programmable chalcogenide-based memory may be programmed prior to packaging or mounting of the memory die on the printed circuit board (e.g., during wafer sort) without disturbing the data stored within the one-time programmable chalcogenide-based memory.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
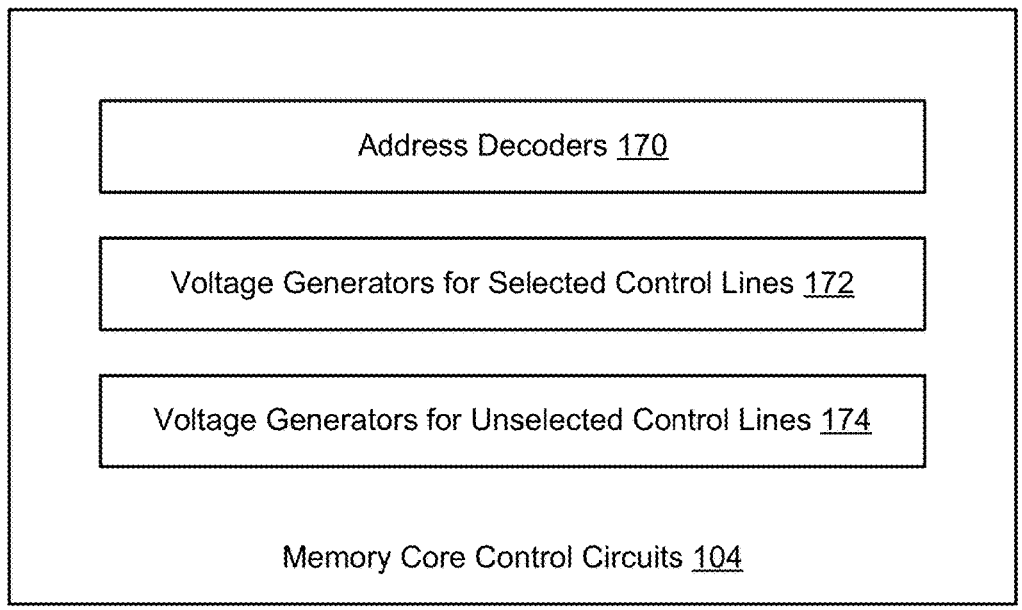

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
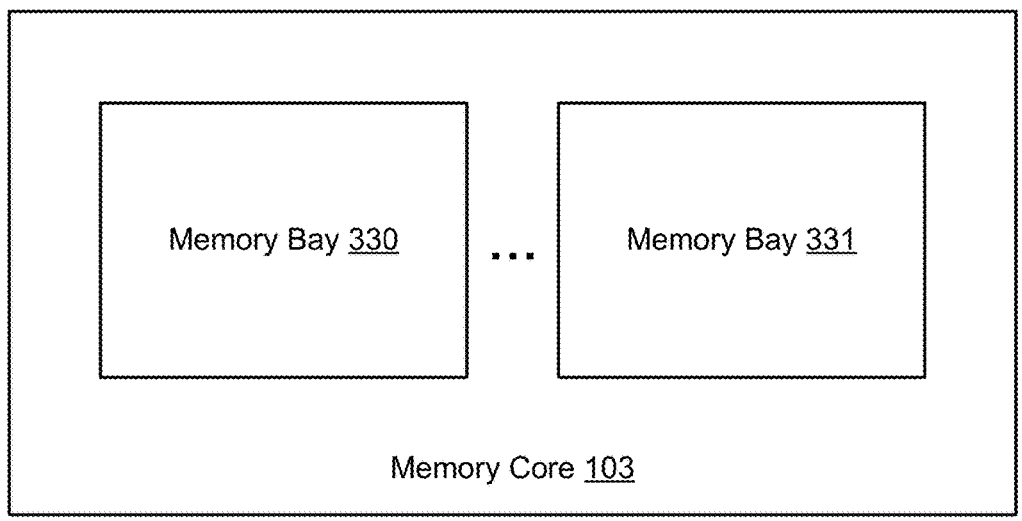

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
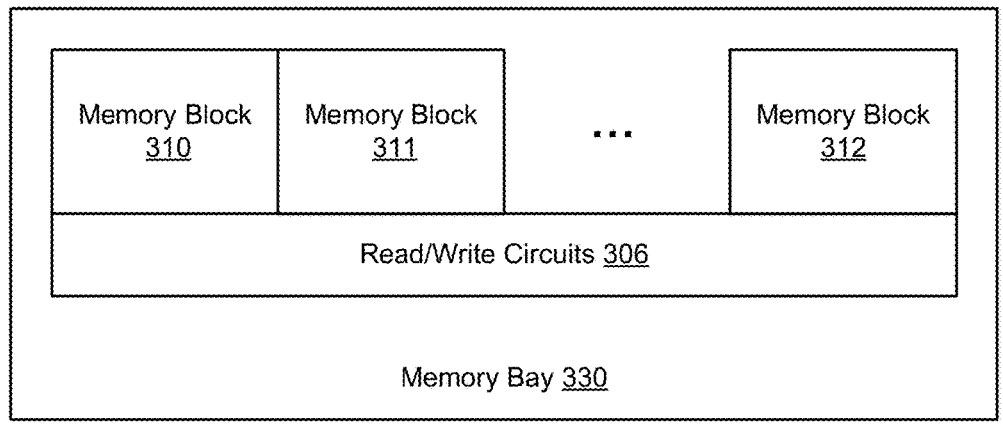

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
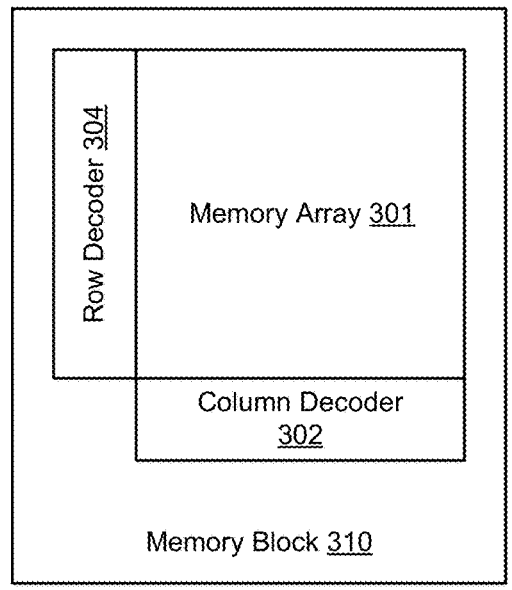

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
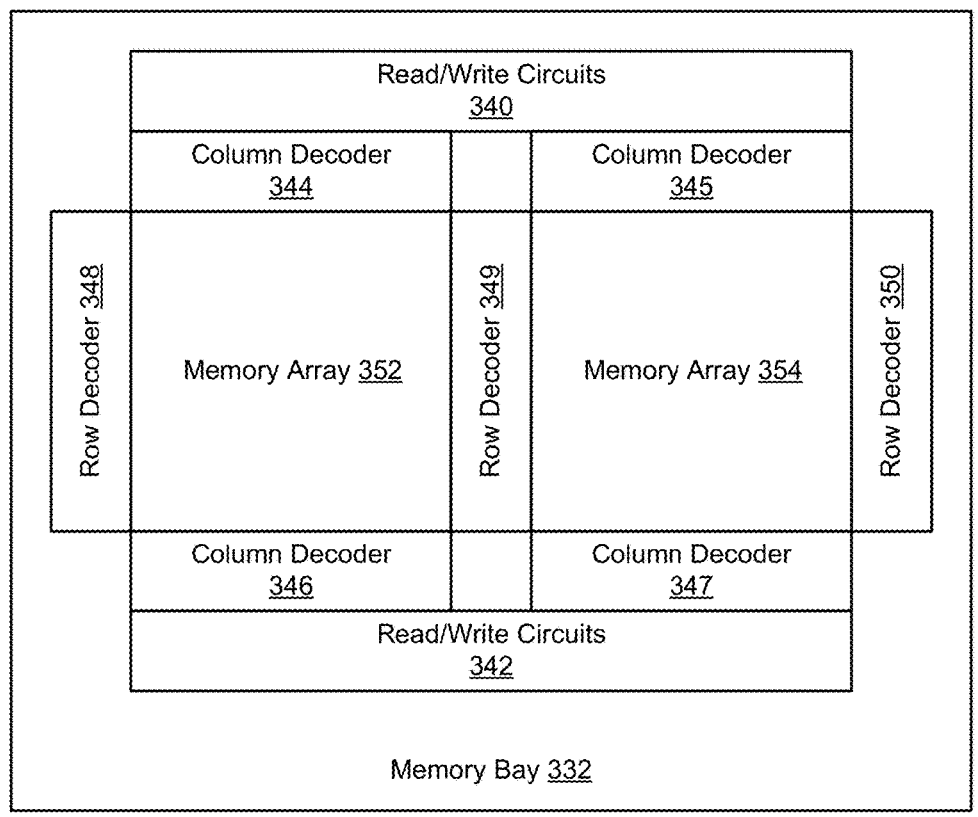

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2:
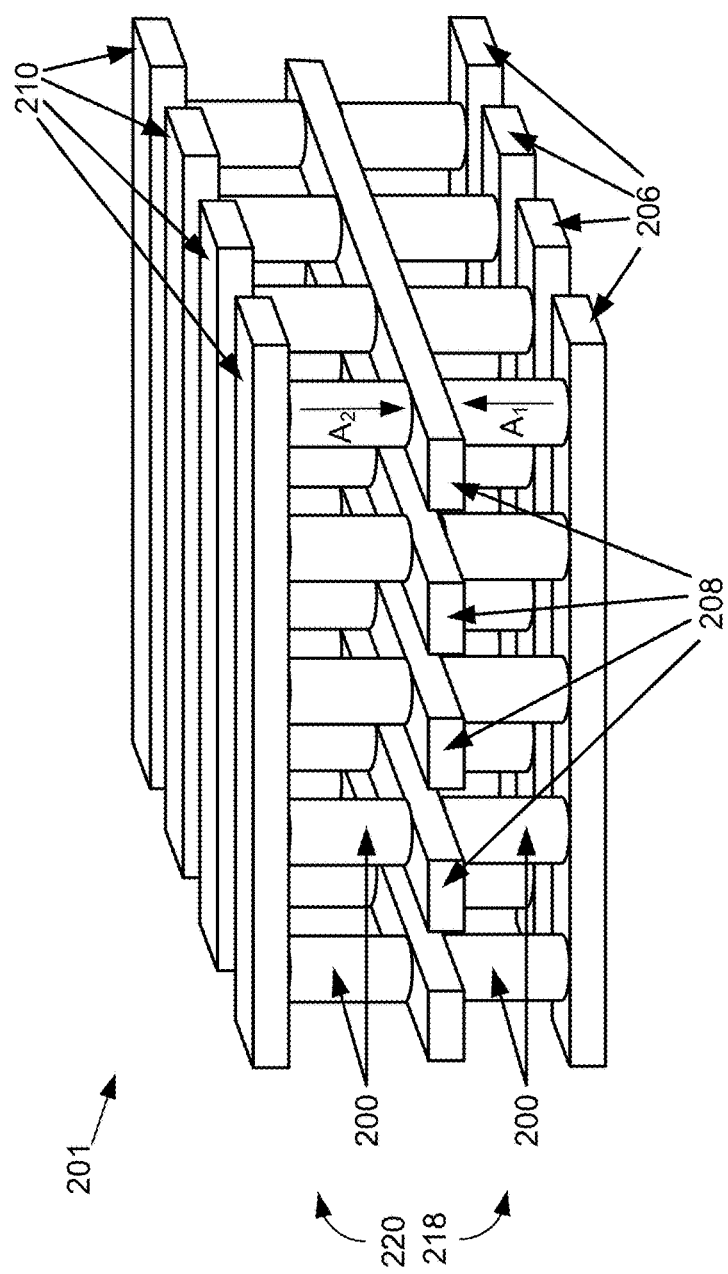
FIGS. 2-3 depict various embodiments of a portion of a three-dimensional memory array.

FIG. 2 depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2, memory array 201 includes a plurality of memory cells 200. The memory cells 200 may include amorphous write-once memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

Referring to FIG. 2, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line.

Referring to FIG. 2, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

In one embodiment, a chalcogenide-based material may be in an initial high-resistivity state that is one-time switchable to a low-resistivity state upon application of a first-fire voltage across the chalcogenide-based material. The high resistance state may represent a binary data "0" while the low resistance state may represent a binary data "1."

Figure 3:
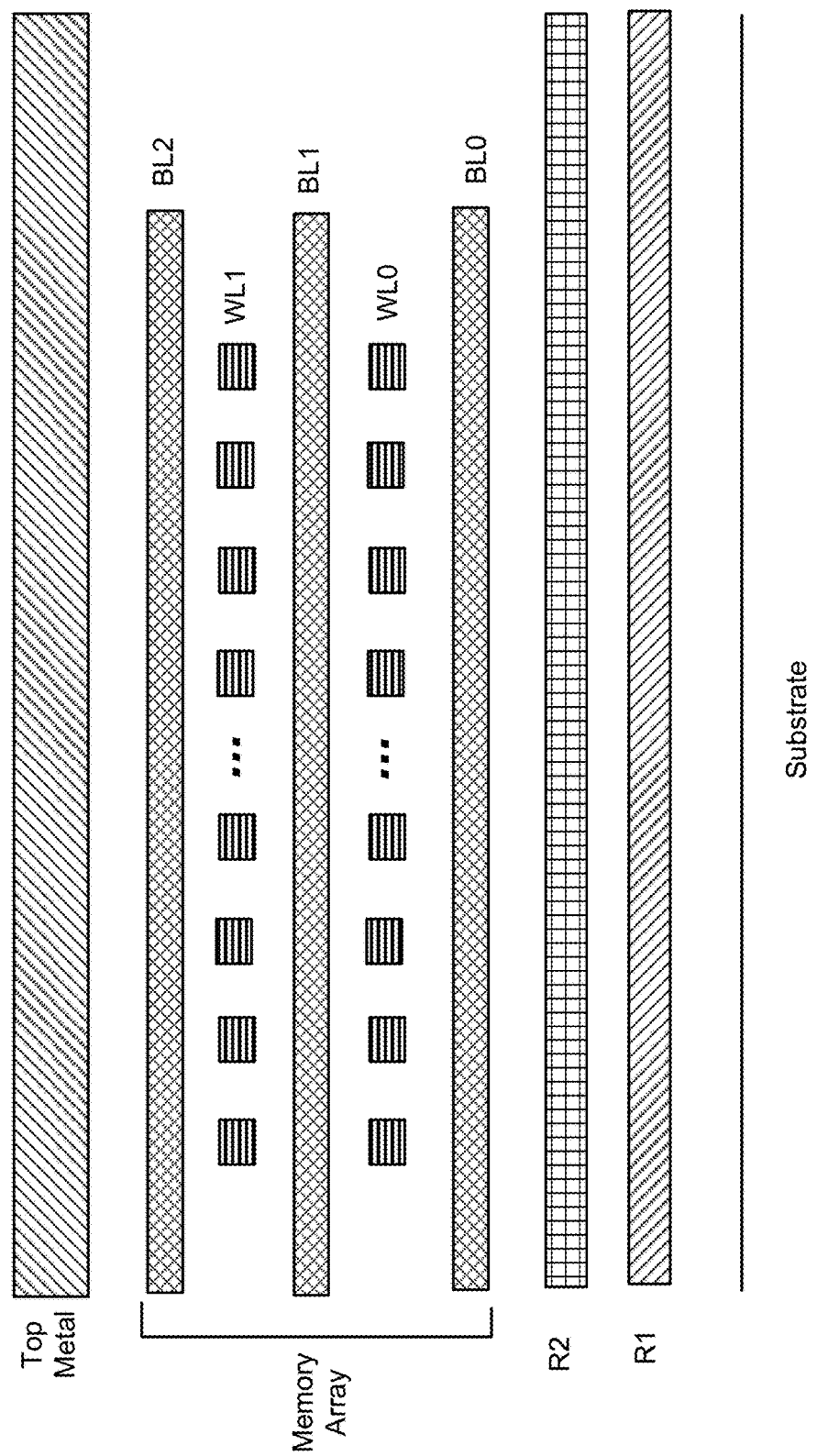

FIG. 3 depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 4A:
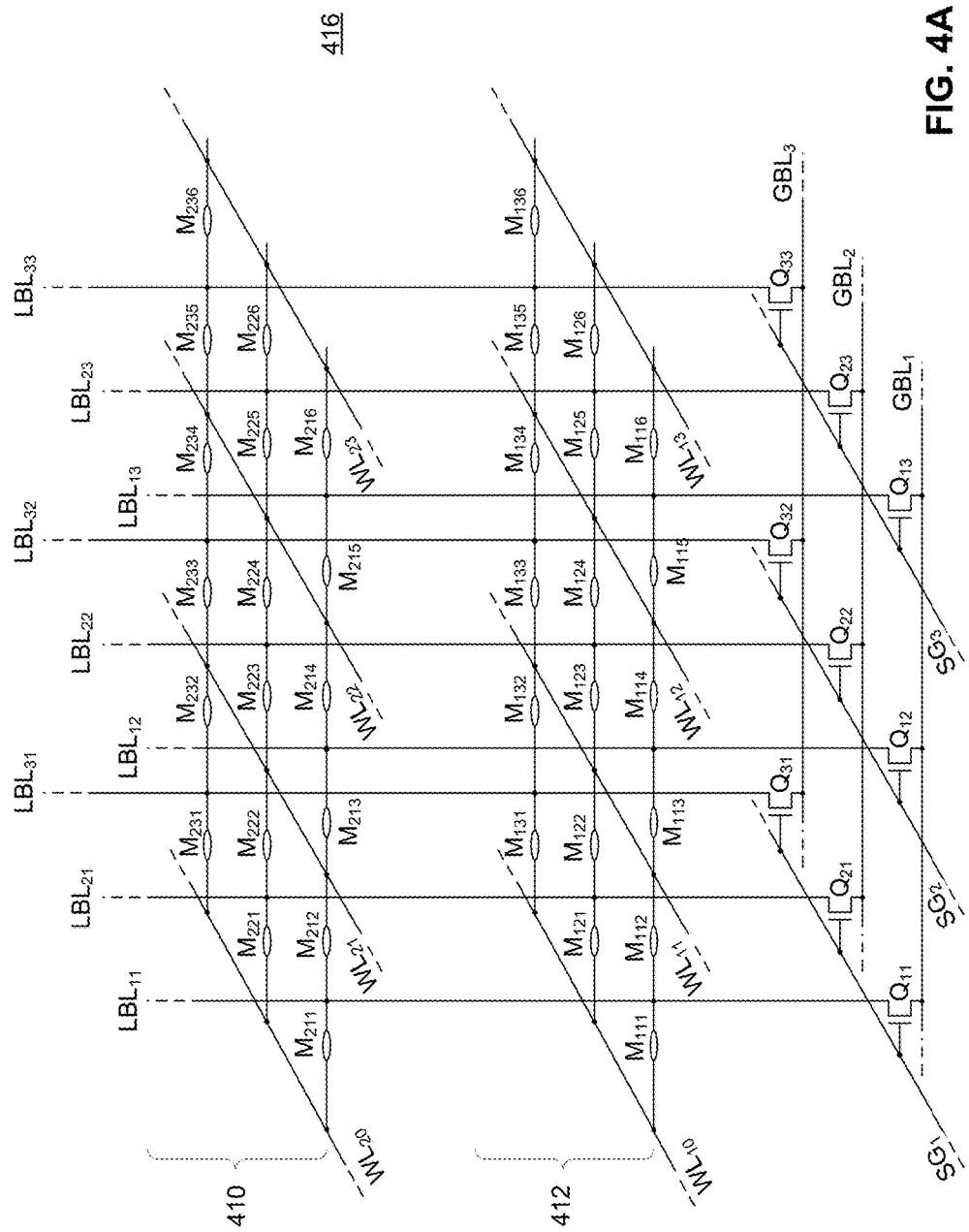
FIGS. 4A-4B depict various embodiments of a portion of a three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a metal oxide, a chalcogenide-based material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

Figure 4B:
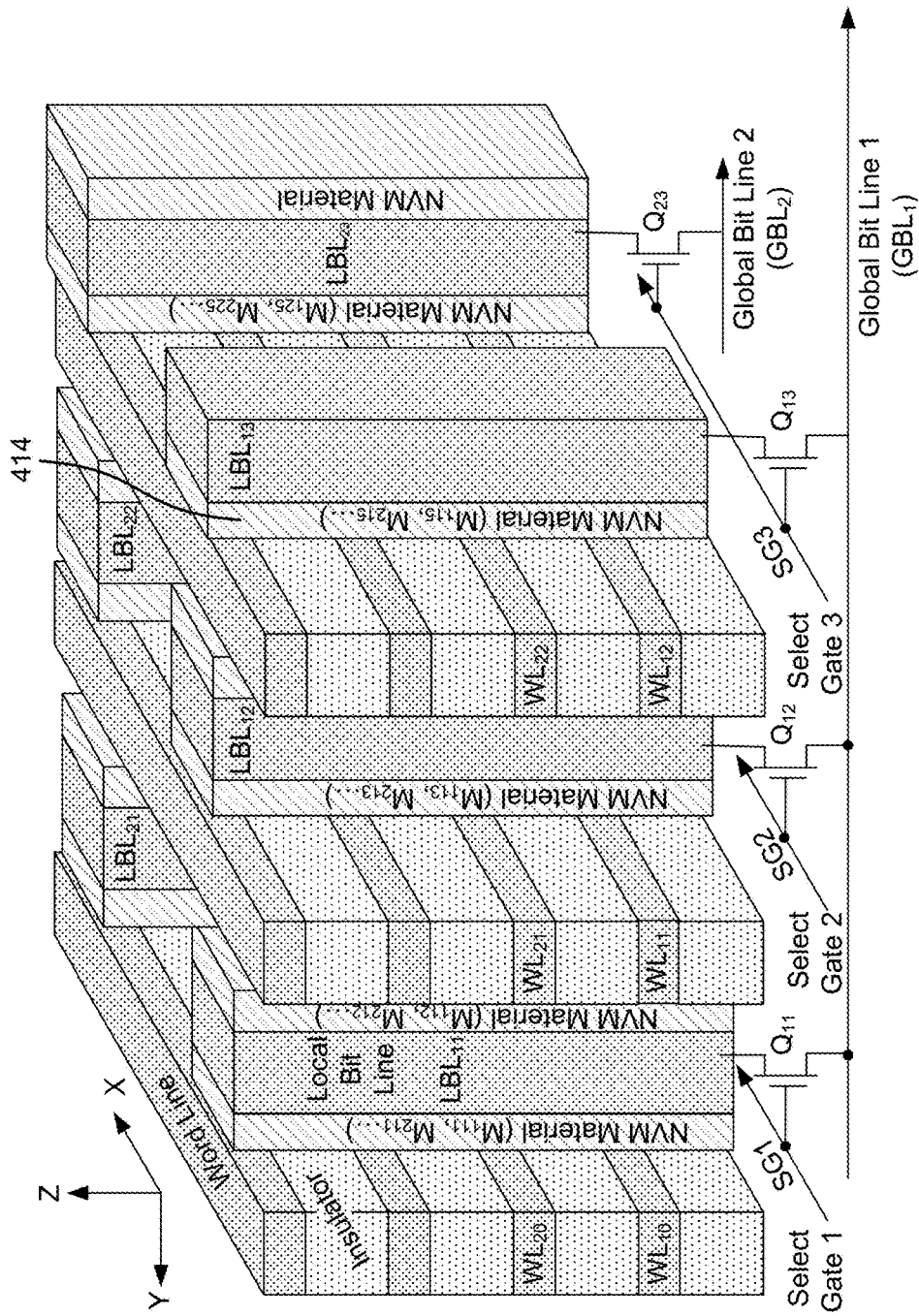

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., titanium oxide, nickel oxide or hafnium oxide), a vertical layer of phase change material (e.g., a chalcogenide material), or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of chalcogenide-based material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 5:
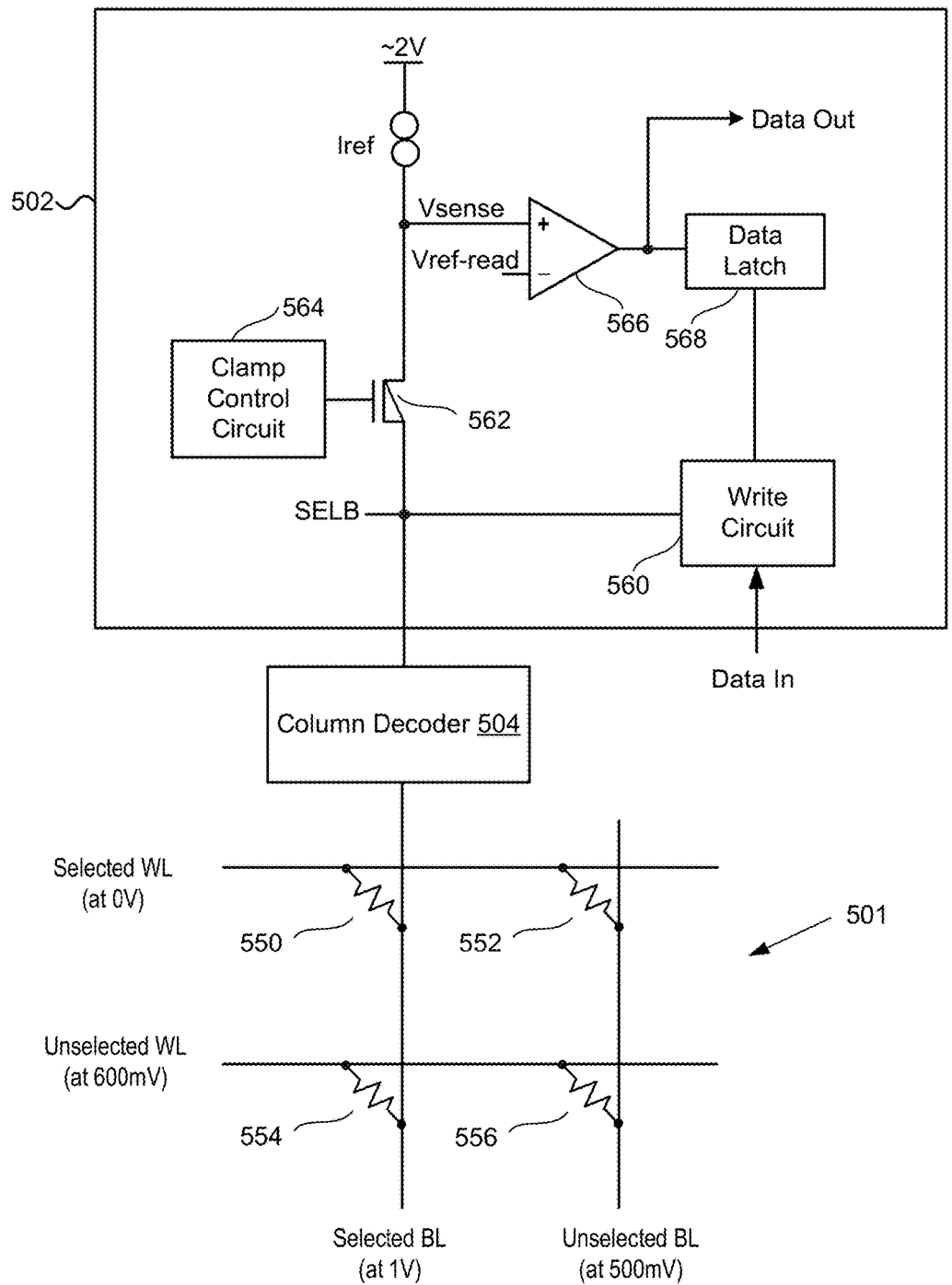
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2. In another embodiment, the portion of a memory array 501 may comprise a memory array with bit lines arranged in a vertical direction that is perpendicular to the substrate, such as memory array 416 in FIG. 4A.

In some cases, the memory chip controller 105 in FIG. 1A or the memory core control circuits 104 in FIG. 1A may comprise representative examples of means for receiving a set of data to be stored using a chalcogenide-based memory or means for writing a set of data to a chalcogenide-based memory. In some cases, the read/write circuit 502 may comprise a representative example of means for writing a chalcogenide-based memory array as a one-time programmable memory array and/or means for reading data from a chalcogenide-based memory array. In some cases, the memory core control circuits 104 in FIG. 1A and/or the read/write circuit 502 in FIG. 5 may comprise representative examples of means for writing a chalcogenide-based memory array as a one-time programmable memory array including performing first-fire forming operations on a first subset of a plurality of chalcogenide-based memory cells that are to store binary "0" data values and/or means for concurrently reading a first set of data from a first subset of a plurality of chalcogenide-based memory cells and a second set of data from a second subset of the plurality of chalcogenide-based memory cells subsequent to performance of first-fire forming operations on the first subset of the plurality of chalcogenide-based memory cells and prior to performance of any first-fire forming operations on the second subset of the plurality of chalcogenide-based memory cells.

The memory array 501 may include a plurality of chalcogenide-based memory cells. Each of the memory cells within the memory array 501 may include a chalcogenide-based material. In one embodiment, the chalcogenide-based material may comprise a germanium-antimony-tellurium compound.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

In another embodiment, if a first binary value (e.g., a data "0") is to be written to a first chalcogenide-based memory cell, then a forming operation in which a first-fire voltage is applied to the first chalcogenide-based memory cell may be performed by the write circuit 560; however, if a second binary value (e.g., a data "1") is to be stored using the first chalcogenide-based memory cell, then the forming operation is not performed on the first chalcogenide-based memory cell or the first chalcogenide-based memory cell will not be stressed by the first-fire voltage during the forming operation.

Figure 6A:
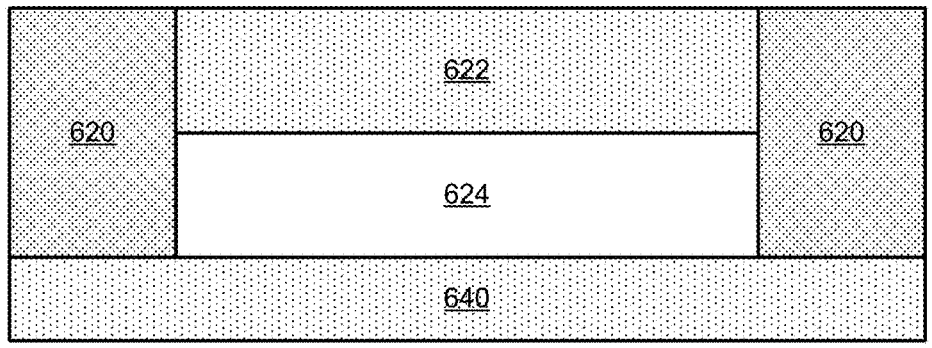
FIGS. 6A-6E depict cross-sectional views of various memory structures that include a chalcogenide-based material.

FIG. 6A depicts a cross-sectional view of a memory structure that includes a chalcogenide-based material 624. The memory structure of FIG. 6A may correspond with a memory cell within a memory array, such as memory array 501 in FIG. 5. As depicted in FIG. 6A, a top electrode 622 and the chalcogenide-based material 624 have been deposited within a first trench of a first width etched within oxide layer 620. The top electrode 622 is directly connected to and abuts the chalcogenide-based material 624 on a top surface of the chalcogenide-based material 624. A bottom surface of the chalcogenide-based material 624 is directly connected to or abuts bottom electrode 640. The oxide layer 620 may comprise silicon dioxide. The top electrode 622 and the bottom electrode 640 may comprise tungsten. The chalcogenide-based material 624 may comprise GST or a chalcogenide glass.

Figure 6B:
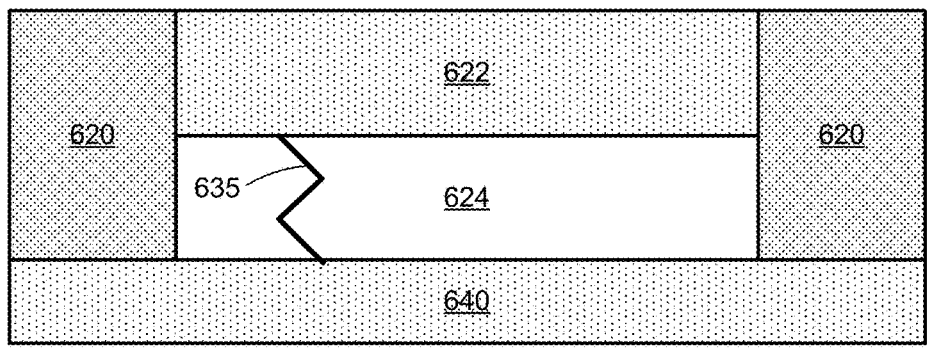

FIG. 6B depicts a cross-sectional view of the memory structure depicted in FIG. 6A that includes the chalcogenide-based material 624 after a forming operation has been performed. As depicted, subsequent to a first-fire voltage (e.g., 8V) being applied across the chalcogenide-based material 624 for a threshold amount of time (e.g., 50 ns), a filamentary path 635 is formed through the chalcogenide-based material 624. In some cases, one or more filamentary paths including filamentary path 635 may be formed through the entire thickness of the chalcogenide-based material 624 or through only a portion of the chalcogenide-based material 624. The filamentary path 635 may alter or lower the resistance of the chalcogenide-based material 624 between the top electrode 622 and the bottom electrode 640. The presence of the filamentary path 635 in FIG. 6B may allow the chalcogenide-based material 624 in FIG. 6B to store a first binary value while the lack of the filamentary path 635 in FIG. 6A may allow the chalcogenide-based material 624 in FIG. 6A to store a second binary value different from the first binary value.

In some embodiments, the number of conductive filamentary paths through a chalcogenide-based material and/or the depth of the one or more conductive filamentary paths through the chalcogenide-based material may be varied depending on the magnitude and the length of time that the first-fire voltage is applied across the chalcogenide-based material. In one example, a multi-level one-time programmable chalcogenide-based memory may comprise a first set of memory cells that have not experienced the first-fire voltage for any length of time, a second set of memory cells that have been programmed using a second programming pulse of a second voltage magnitude and a second pulse width, a third set of memory cells that have been programmed using a third programming pulse of a third voltage magnitude and a third pulse width greater than the second pulse width, and a fourth set of memory cells that have been programmed using a fourth programming pulse of a fourth voltage magnitude greater than the second voltage magnitude and a fourth pulse width greater than the second pulse width. In another example, a multi-level one-time programmable chalcogenide-based memory may comprise four sets of memory cells and a first-fire voltage (e.g., 4V) may be applied to three of the four sets over a different period of time; the first-fire voltage may not be applied to a first set of the four sets, the first-fire voltage may be applied to a second set of the four sets for 20 ns, the first-fire voltage may be applied to a third set of the four sets for 50 ns, and the first-fire voltage may be applied to a fourth set of the four sets for 100 ns.

Figure 6C:
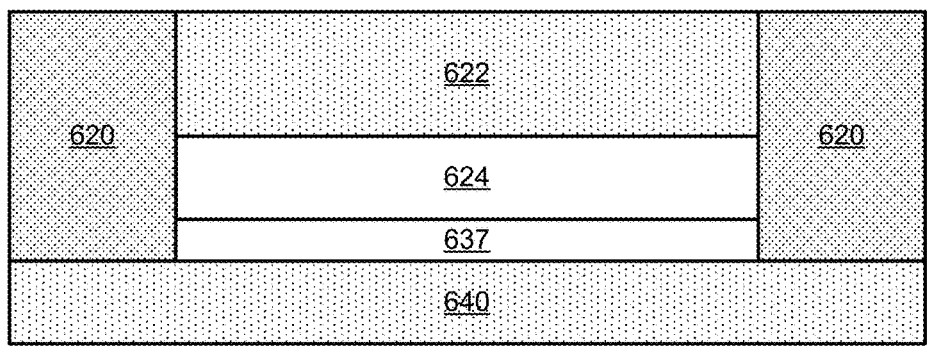

FIG. 6C depicts a cross-sectional view of a memory structure that includes a chalcogenide-based material 624 and a layer of carbon 637. The memory structure of FIG. 6C may correspond with a memory cell within a memory array, such as memory array 501 in FIG. 5. As depicted in FIG. 6C, a top electrode 622 and the chalcogenide-based material 624 have been deposited within a first trench of a first width within oxide layer 620. The top electrode 622 is directly connected to and abuts the chalcogenide-based material 624 on a top surface of the chalcogenide-based material 624. A bottom surface of the chalcogenide-based material 624 is directly connected to or abuts the layer of carbon 637. A bottom surface of the layer of carbon 637 is directly connected to or abuts the bottom electrode 640. The layer of carbon 637 may act as a barrier layer to prevent the migration of ions from the chalcogenide-based material 624 into the bottom electrode 640.

Figure 6D:
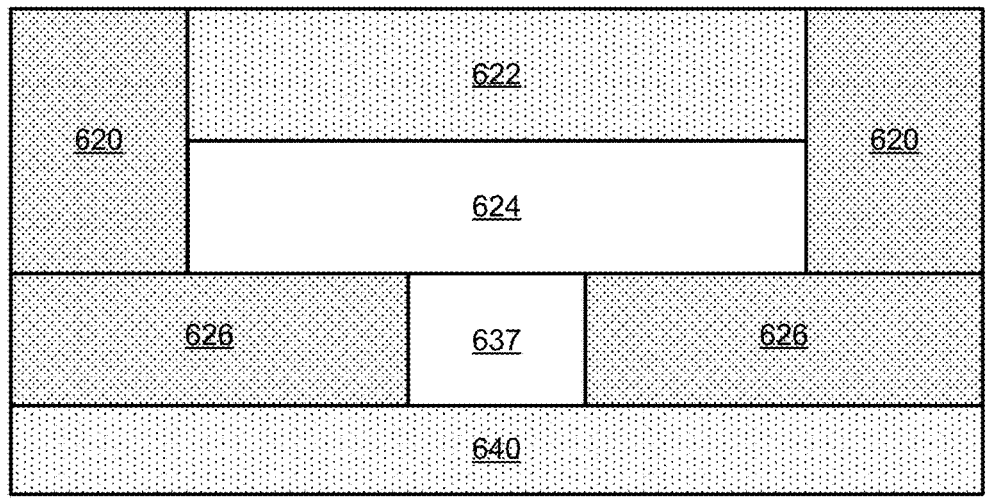

FIG. 6D depicts a cross-sectional view of a memory structure that also includes a chalcogenide-based material 624 and a layer of carbon 637. The memory structure of FIG. 6D may correspond with a memory cell within a memory array, such as memory array 501 in FIG. 5. As depicted in FIG. 6D, the top electrode 622 and the chalcogenide-based material 624 have been deposited within a first trench of a first width within oxide layer 620. The top electrode 622 is directly connected to and abuts the chalcogenide-based material 624 on a top surface of the chalcogenide-based material 624. A bottom surface of the chalcogenide-based material 624 is directly connected to or abuts the layer of carbon 637. The layer of carbon 637 has been deposited within a second trench of a second width less than the first width within oxide layer 626. The bottom surface of the layer of carbon 637 is directly connected to or abuts the bottom electrode 640. In some cases, the layer of carbon 637 may act as both a barrier layer to prevent the migration of ions from the chalcogenide-based material 624 into the bottom electrode 640.

Figure 6E:
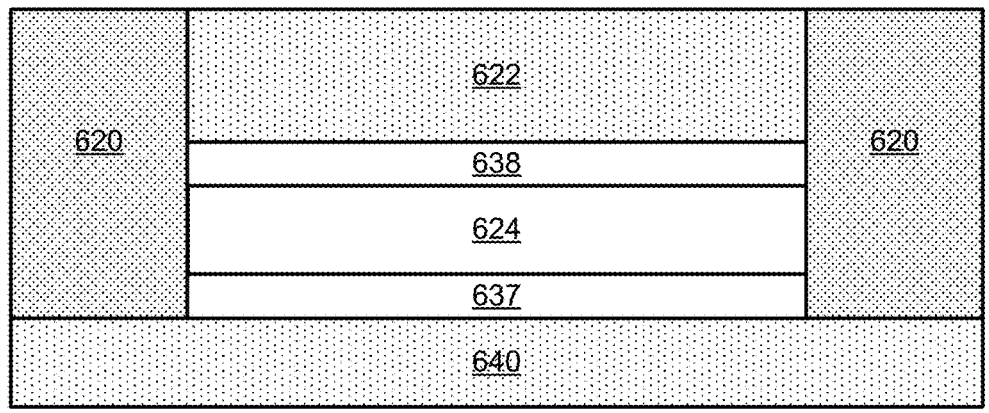

FIG. 6E depicts a cross-sectional view of a memory structure that includes a chalcogenide-based material 624, a bottom layer of carbon 637, and a top layer of carbon 638. The memory structure of FIG. 6E may correspond with a memory cell within a memory array, such as memory array 501 in FIG. 5. As depicted in FIG. 6E, the top electrode 622 is directly connected to and abuts the top layer of carbon 638. The top layer of carbon 638 is directly connected to and abuts the chalcogenide-based material 624 on a top surface of the chalcogenide-based material 624. A bottom surface of the chalcogenide-based material 624 is directly connected to or abuts the bottom layer of carbon 637. The bottom layer of carbon 637 is directly connected to or abuts the bottom electrode 640.

Figure 6F:
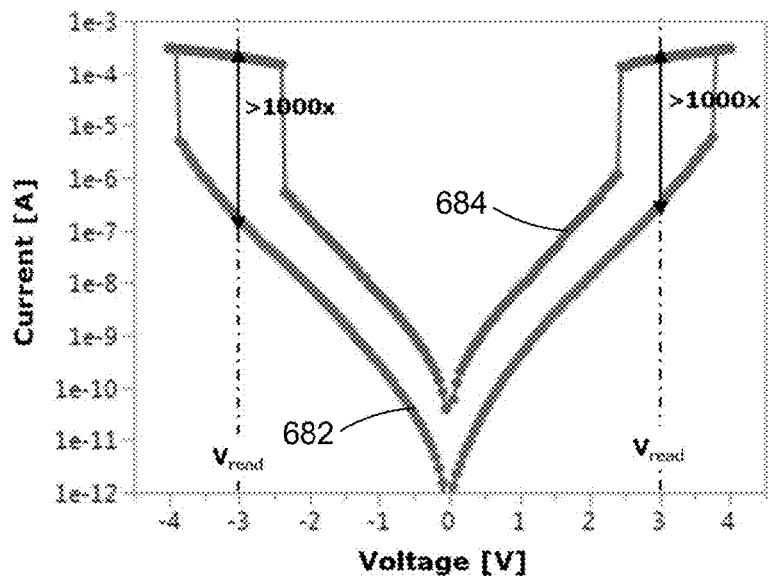
FIGS. 6F-6G depict memory cell IV characteristics for a chalcogenide-based memory.

FIG. 6F depicts IV characteristics for a chalcogenide-based memory cell 684 that has experienced the application of a first-fire forming voltage for a threshold period of time (e.g., 50 ns) such that one or more filamentary paths have been formed within the chalcogenide-based memory cell 684 and a native chalcogenide-based memory cell 682 that has not experienced application of a first-fire forming voltage. The chalcogenide-based memory cells depicted in FIG. 6F may comprise $Ge_{17}Te_{50}As_{33}$. As depicted, the IV curves for both memory cells 682 and 684 are symmetric and with a voltage difference of 3V applied across the memory cells (e.g., Vread is 3V), there is a greater than 1000× difference in memory cell currents between the memory cells 682 and 684.

Figure 6G:
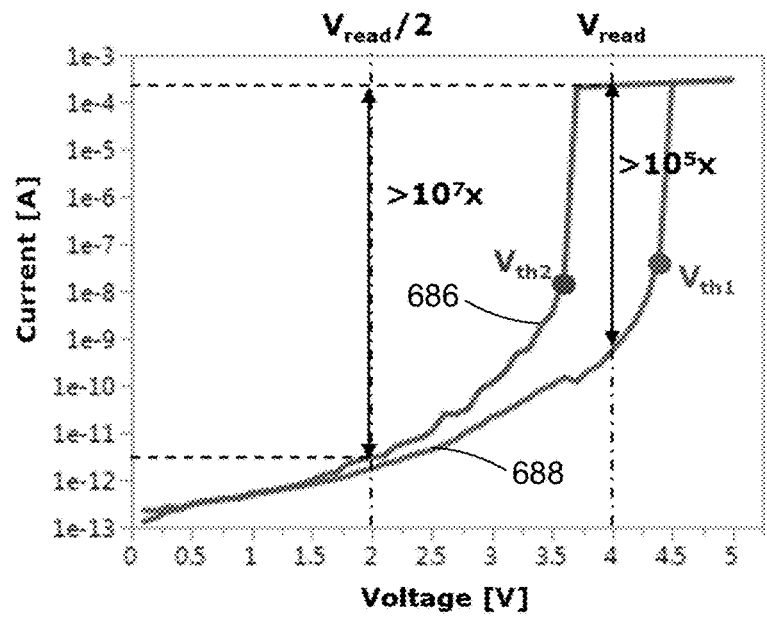

FIG. 6G depicts IV characteristics for a chalcogenide-based memory cell 686 that has experienced the application of a first-fire forming voltage for a threshold period of time (e.g., 30 ns) such that one or more filamentary paths have been formed within the chalcogenide-based memory cell 686 and a native chalcogenide-based memory cell 688 that has not experienced application of a first-fire forming voltage. The chalcogenide-based memory cells depicted in FIG. 6G may comprise $Ge_{10}Se_{54}As_{36}$. As depicted, with a voltage difference of 4V applied across the memory cells (e.g., Vread is 4V), there is a greater than 10000× difference in memory cell currents between the memory cells 686 and 688.

Figure 7:
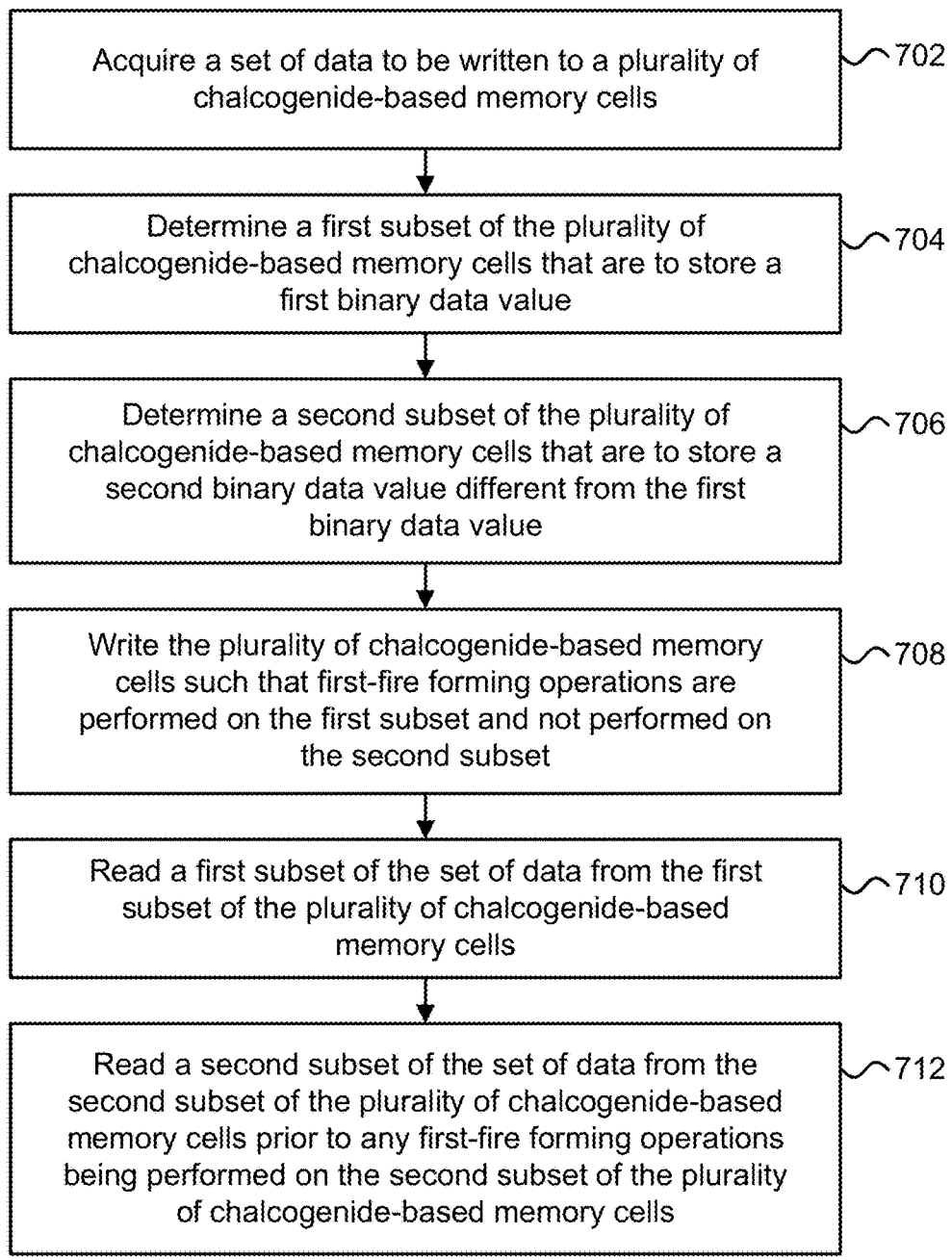
FIG. 7 is a flowchart describing one embodiment of a process for writing data to a chalcogenide-based memory array and reading data from the chalcogenide-based memory array.

FIG. 7 is a flowchart describing one embodiment of a process for writing data to a chalcogenide-based memory array and reading data from the chalcogenide-based memory array. In one embodiment, the process of FIG. 7 may be performed by a memory chip controller, such as the memory chip controller 105 depicted in FIG. 1A.

In step 702, a set of data to be written to a plurality of chalcogenide-based memory cells is acquired or received. The set of data may comprise data received from a host or a controller to be written to the plurality of chalcogenide-based memory cells. In step 704, a first subset of the plurality of chalcogenide-based memory cells that are to store a first binary data value (e.g., a data "0") is determined. In step 706, a second subset of the plurality of chalcogenide-based memory cells that are to store a second binary data value (e.g., a data "1") different from the first binary data value is determined. In step 708, the plurality of chalcogenide-based memory cells is written such that first-fire forming operations are performed on the first subset and not performed on the second subset. In one embodiment, a first-fire voltage may be applied to the first subset of the plurality of chalcogenide-based memory cells during a forming operation, while the first-fire voltage is not applied to the second subset of the plurality of chalcogenide-based memory cells (e.g., by inhibiting the second subset during the forming operation). In one example, the first-fire voltage (e.g., 8V) may be applied to a first word line connected to a first memory cell of the first subset and a second memory cell of the second subset; in this case, a first bit line connected to the first memory cell may be set to a selected bit line voltage (e.g., 0V) to place the first-fire voltage across the first memory cell while a second bit line connected to the second memory cell may be set to an unselected bit line voltage (e.g., 8V) to inhibit or prevent the first-fire voltage from being placed across the second memory cell.

In step 710, a first subset of the set of data from the first subset of the plurality of chalcogenide-based memory cells is read. In step 712, a second subset of the set of data from the second subset of the plurality of chalcogenide-based memory cells is read prior to any first-fire forming operations being performed on the second subset of the plurality of chalcogenide-based memory cells or prior to the first-fire voltage being placed across any of the second subset of chalcogenide-based memory cells. In one embodiment, the first subset of the set of data and the second subset of the set a data may be concurrently read from the plurality of chalcogenide-based memory cells. The data stored within the plurality of chalcogenide-based memory cells may be read or interpreted via sensing of the plurality of chalcogenide-based memory cells using a read/write circuit, such as the read/write circuit 502 in FIG. 5.

One embodiment of the disclosed technology includes a chalcogenide-based memory array including a plurality of amorphous chalcogenide-based memory cells, a receiving circuit configured to receive a set of data, a control circuit configured to identify a first subset of the set of data corresponding with a first binary data value and identify a second subset of the set of data corresponding with a second binary data value, and a write circuit configured to form filamentary paths within a first subset of the plurality of amorphous chalcogenide-based memory cells to store the first subset of the set of data and to define the second subset of the plurality of amorphous chalcogenide-based memory cells without any filamentary paths as storing the second subset of the set of data.

One embodiment of the disclosed technology includes a chalcogenide-based memory array including a plurality of amorphous chalcogenide-based memory cells, a receiving circuit configured to receive a set of data, a control circuit configured to identify a first subset of the set of data corresponding with a first binary data value and identify a second subset of the set of data corresponding with a second binary data value, and a write circuit configured to form filamentary paths within a first subset of the plurality of amorphous chalcogenide-based memory cells to store the first subset of the set of data using the first subset of the plurality of amorphous chalcogenide-based memory cells without any filamentary paths formed within a second subset of the plurality of amorphous chalcogenide-based memory cells to store the second subset of the set of data using the second subset of the plurality of amorphous chalcogenide-based memory cells.

One embodiment of the disclosed technology includes a chalcogenide-based memory array including a plurality of chalcogenide-based memory cells and one or more control circuits configured to perform a first-fire forming operation on a first subset of the plurality of chalcogenide-based memory cells that are to be set into a second resistance state and not on a second subset of the plurality of chalcogenide-based memory cells that are to remain in a first resistance state. The one or more control circuits configured to read data stored within the first subset of the plurality of chalcogenide-based memory cells and the second subset of the plurality of chalcogenide-based memory cells prior to performance of any first-fire forming operations on the second subset of the plurality of chalcogenide-based memory cells.

One embodiment of the disclosed includes acquiring a set of data to be written to a chalcogenide-based memory array. The chalcogenide-based memory array includes a plurality of chalcogenide-based memory cells. The method further comprises determining a first subset of the plurality of chalcogenide-based memory cells that are to store a first binary data value based on the set of data, determining a second subset of the plurality of chalcogenide-based memory cells that are to store a second binary data value based on the set of data, writing the chalcogenide-based memory array as a one-time programmable memory array in which first-fire forming operations are performed on the first subset of the plurality of chalcogenide-based memory cells and not performed on the second subset of the plurality of chalcogenide-based memory cells, and concurrently reading a first subset of the set of data from the first subset of the plurality of chalcogenide-based memory cells and a second subset of the set of data from the second subset of the plurality of chalcogenide-based memory cells prior to any first-fire forming operations being performed on the second subset of the plurality of chalcogenide-based memory cells.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a chalcogenide-based memory array including a plurality of amorphous chalcogenide-based memory cells;
a receiving circuit configured to receive a set of data;
a control circuit configured to identify a first subset of the set of data corresponding with a first binary data value and identify a second subset of the set of data corresponding with a second binary data value; and
a write circuit configured to form filamentary paths within a first subset of the plurality of amorphous chalcogenide-based memory cells to store the first subset of the set of data and to define a second subset of the plurality of amorphous chalcogenide-based memory cells without any filamentary paths as storing the second subset of the set of data.

2. The apparatus of claim 1, wherein:
the write circuit configured to perform first-fire forming operations on only the first subset of the plurality of amorphous chalcogenide-based memory cells within the chalcogenide-based memory array; and
a read circuit configured to concurrently interpret stored data from the first subset of the plurality of amorphous chalcogenide-based memory cells and the second subset of the plurality of amorphous chalcogenide-based memory cells and output the stored data.

3. The apparatus of claim 1, wherein:
the plurality of amorphous chalcogenide-based memory cells includes a first chalcogenide-based memory cell comprising a first layer of a chalcogenide glass arranged between a first word line and a first bit line within the chalcogenide-based memory array.

4. The apparatus of claim 3, wherein:
the first layer of the chalcogenide glass directly abuts the first word line and the first layer of the chalcogenide glass directly abuts the first bit line; and
the chalcogenide glass comprises one of a first alloy of germanium, tellurium, and arsenic or a second alloy of germanium, selenium, and arsenic.

5. The apparatus of claim 1, wherein:
the plurality of amorphous chalcogenide-based memory cells includes a first chalcogenide-based memory cell comprising a first layer of a chalcogenide glass and a first layer of carbon arranged between a first word line and a first bit line within the chalcogenide-based memory array.

6. The apparatus of claim 5, wherein:
the first layer of the chalcogenide glass directly abuts the first layer of carbon and the first layer of the chalcogenide glass directly abuts the first bit line.

7. The apparatus of claim 5, wherein:
the first layer of the chalcogenide glass directly abuts the first layer of carbon and the first layer of the chalcogenide glass directly abuts a second layer of carbon, the second layer of carbon directly abuts the first bit line.

8. The apparatus of claim 1, wherein:
the first subset of the plurality of amorphous chalcogenide-based memory cells corresponds with a page of data stored within the chalcogenide-based memory array; and
the write circuit configured to write a locking code to prevent subsequent writes to the page of data in a non-volatile memory subsequent to performance of forming operations on the first subset of the plurality of amorphous chalcogenide-based memory cells.

9. The apparatus of claim 8, wherein:
the non-volatile memory corresponds with an overhead portion of the page of data.

10. The apparatus of claim 1, wherein:
the chalcogenide-based memory array comprises a three-dimensional memory array.

11. An apparatus, comprising:
a chalcogenide-based memory array including a plurality of chalcogenide-based memory cells; and
one or more control circuits configured to perform a first-fire forming operation on a first subset of the plurality of chalcogenide-based memory cells that are to be set into a second resistance state and not on a second subset of the plurality of chalcogenide-based memory cells that are to remain in a first resistance state, the one or more control circuits configured to read data stored within the first subset of the plurality of chalcogenide-based memory cells and the second subset of the plurality of chalcogenide-based memory cells without a performance of any first-fire forming operations on the second subset of the plurality of chalcogenide-based memory cells.

12. The apparatus of claim 11, wherein:
the second resistance state is less than the first resistance state.

13. The apparatus of claim 11, wherein:
the one or more control circuits configured to perform the first-fire forming operation on only the first subset of the plurality of chalcogenide-based memory cells within the chalcogenide-based memory array.

14. The apparatus of claim 11, wherein:
the plurality of chalcogenide-based memory cells includes a first chalcogenide-based memory cell comprising a first layer of a chalcogenide glass arranged between a first word line layer and a first bit line layer within the chalcogenide-based memory array.

15. The apparatus of claim 14, wherein:
the first layer of the chalcogenide glass directly abuts the first word line layer and the first layer of the chalcogenide glass directly abuts the first bit line layer; and
the first word line layer comprises tungsten.

16. The apparatus of claim 11, wherein:
the plurality of chalcogenide-based memory cells includes a first chalcogenide-based memory cell comprising a first layer of a chalcogenide glass and a first layer of carbon arranged between a first word line layer and a first bit line layer within the chalcogenide-based memory array, the first layer of the chalcogenide glass directly abuts the first layer of carbon and the first layer of the chalcogenide glass directly abuts a second layer of carbon, the second layer of carbon directly abuts the first bit line layer.

17. The apparatus of claim 11, wherein:
the first subset of the plurality of chalcogenide-based memory cells corresponds with a page of data stored within the chalcogenide-based memory array; and
the one or more control circuits configured to write a locking code to prevent subsequent writes to the page of data subsequent to performance of the first-fire forming operations on the first subset of the plurality of chalcogenide-based memory cells.

18. A method, comprising:
acquiring a set of data to be written to a chalcogenide-based memory array, the chalcogenide-based memory array includes a plurality of chalcogenide-based memory cells;
determining a first subset of the plurality of chalcogenide-based memory cells that are to store a first binary data value based on the set of data;
determining a second subset of the plurality of chalcogenide-based memory cells that are to store a second binary data value based on the set of data;
writing the chalcogenide-based memory array as a one-time programmable memory array in which first-fire forming operations are performed on the first subset of the plurality of chalcogenide-based memory cells and not performed on the second subset of the plurality of chalcogenide-based memory cells; and
concurrently reading a first subset of the set of data from the first subset of the plurality of chalcogenide-based memory cells and a second subset of the set of data from the second subset of the plurality of chalcogenide-based memory cells prior to any first-fire forming operations being performed on the second subset of the plurality of chalcogenide-based memory cells.

19. The method of claim 18, wherein:
the plurality of chalcogenide-based memory cells includes a first chalcogenide-based memory cell comprising a first layer of a chalcogenide glass and a first layer of carbon arranged between a first word line layer and a first bit line layer within the chalcogenide-based memory array, the first layer of the chalcogenide glass directly abuts the first layer of carbon and the first layer of the chalcogenide glass directly abuts the first bit line layer.

20. A system, comprising:
a chalcogenide-based memory array including a plurality of chalcogenide-based memory cells;
means for writing the chalcogenide-based memory array as a one-time programmable memory array including performing first-fire forming operations on a first subset of the plurality of chalcogenide-based memory cells that are to store binary "0" data values and not on a second subset of the plurality of chalcogenide-based memory cells that are to store binary "1" data values; and
means for concurrently reading a first set of data from the first subset of the plurality of chalcogenide-based memory cells and a second set of data from the second subset of the plurality of chalcogenide-based memory cells subsequent to performance of the first-fire forming operations on the first subset of the plurality of chalcogenide-based memory cells and prior to performance of any first-fire forming operations on the second subset of the plurality of chalcogenide-based memory cells.

21. A system, comprising:
a cross-point memory array including a plurality of chalcogenide-based memory cells, the cross-point memory array includes a first word line connected to the plurality of chalcogenide-based memory cells and a set of bit lines connected to the plurality of chalcogenide-based memory cells;
a write circuit configured to apply a forming voltage to the first word line and a selected bit line voltage to a first subset of the set of bit lines connected to a first subset of the plurality of chalcogenide-based memory cells to form filamentary paths within the first subset of the plurality of chalcogenide-based memory cells; and
a read circuit configured to concurrently read a first subset of a set of data from the first subset of the plurality of chalcogenide-based memory cells and a second subset of the set of data from a second subset of the plurality of chalcogenide-based memory cells without any filamentary paths within the second subset of the plurality of chalcogenide-based memory.

22. The system of claim 21, wherein:
the plurality of chalcogenide-based memory cells includes a first chalcogenide-based memory cell comprising a first layer of a chalcogenide glass arranged between the first word line and a first bit line of the set of bit lines.

23. The system of claim 22, wherein:
the first layer of the chalcogenide glass directly abuts the first word line and the first layer of the chalcogenide glass directly abuts the first bit line.

24. The system of claim 21, wherein:
the plurality of chalcogenide-based memory cells includes a first chalcogenide-based memory cell comprising a first layer of a chalcogenide glass and a first layer of carbon arranged between the first word line and a first bit line of the set of bit lines.

25. The system of claim 24, wherein:
the first layer of the chalcogenide glass directly abuts the first layer of carbon and the first layer of the chalcogenide glass directly abuts the first bit line.

26. The apparatus of claim 3, wherein:
the chalcogenide-based memory array is arranged on a memory die; and
a melting temperature of the chalcogenide glass is greater than a maximum manufacturing temperature used during mounting of a package that includes the memory die.

27. The apparatus of claim 3, wherein:
the chalcogenide-based memory array is arranged on a memory die; and
a melting temperature of the chalcogenide glass is greater than a maximum manufacturing temperature used during soldering of a package containing the memory die to a printed circuit board.

* * * * *